United States Patent
McClean et al.

(10) Patent No.: US 11,728,613 B2
(45) Date of Patent: Aug. 15, 2023

(54) DOPED FIBER AMPLIFIER HAVING PASS-THROUGH PUMP LASER

(71) Applicant: II-VI Delaware, Inc, Wilmington, DE (US)

(72) Inventors: Ian Peter McClean, Brixham (GB); Nadhum Kadhum Zayer, Devon (GB); Martin Richard Williams, Big Flats, NY (US)

(73) Assignee: II-VI DELAWARE, INC., Wilmington, DE (US)

( * ) Notice: Subject to any disclaimer, the term of this patent is extended or adjusted under 35 U.S.C. 154(b) by 370 days.

(21) Appl. No.: 17/157,171

(22) Filed: Jan. 25, 2021

(65) Prior Publication Data

US 2022/0239052 A1    Jul. 28, 2022

(51) Int. Cl.
*H01S 3/0941* (2006.01)
*H01S 3/067* (2006.01)
(Continued)

(52) U.S. Cl.
CPC .......... *H01S 3/0941* (2013.01); *H01S 3/0675* (2013.01); *H01S 3/06716* (2013.01); *H01S 3/06754* (2013.01); *H01S 3/094003* (2013.01); *H01S 3/094053* (2013.01); *H01S 3/1608* (2013.01); *H01S 5/50* (2013.01); *H01S 5/0239* (2021.01); *H01S 5/041* (2013.01); *H01S 5/40* (2013.01); *H01S 5/5027* (2013.01)

(58) Field of Classification Search
None
See application file for complete search history.

(56) References Cited

U.S. PATENT DOCUMENTS 5,369,524 A * 11/1994 Pocholle ............. H01S 3/06708
                                                359/345
6,330,264 B1 * 12/2001 Kussmaul ......... H01S 3/094003
                                                372/75
(Continued)

FOREIGN PATENT DOCUMENTS

WO    WO-9318561 A1 *  9/1993  ....... H01S 3/094003
WO    WO-03084006 A2 * 10/2003  ............. H01S 5/146

OTHER PUBLICATIONS

Communication Components, 980nm Pump Lasers—Dual Chip, website: <https://optical.communications.ii-vi.com/node/4723> II-VI Incorporated, retrieved Aug. 13, 2020.

*Primary Examiner* — Eric L Bolda
(74) *Attorney, Agent, or Firm* — Blank Rome LLP (57) ABSTRACT

An amplifier operable with an electric drive signal can amplify signal light having a signal wavelength. A laser diode has an active section with input and output facets. The facets are in optical communication with the signal light and are configured to pass the signal light through the laser diode. The active section is configured to generate pump light in response to injection of the electrical drive signal into the active section. The pump light has a pump wavelength different from the signal wavelength. A doped fiber doped with an active dopant is in optical communication with the signal light and is in optical communication with at least a portion of the pump light from the laser diode. The pump wavelength of the pump light is configured to interact with the active dopant of the fiber and thereby amplify the signal light.

20 Claims, 7 Drawing Sheets

(51) Int. Cl.
*H01S 3/16* (2006.01)
*H01S 3/094* (2006.01)
*H01S 5/0239* (2021.01)
*H01S 5/50* (2006.01)
*H01S 5/04* (2006.01)
*H01S 5/40* (2006.01)

(56) References Cited

U.S. PATENT DOCUMENTS

| | | |
|---|---|---|
| 9,503,181 B2 | 11/2016 | McClean et al. |
| 9,590,390 B1* | 3/2017 | Tatah ................... G11B 5/314 |
| 10,320,151 B1* | 6/2019 | Traverso ............... H01S 5/1203 |
| 2003/0156617 A1* | 8/2003 | Baney ................... H01S 5/146 |
| | | 372/96 |
| 2005/0243882 A1* | 11/2005 | He ......................... H01S 5/026 |
| | | 372/50.1 |
| 2006/0239321 A1* | 10/2006 | Kume ................. G11B 7/1275 |
| | | 372/50.122 |
| 2015/0333472 A1* | 11/2015 | Demir ................ H01S 5/02315 |
| | | 372/27 |

\* cited by examiner

DOPED FIBER AMPLIFIER HAVING PASS-THROUGH PUMP LASER

BACKGROUND OF THE DISCLOSURE

In a doped fiber amplifier, an optical signal is transmitted through a doped fiber. At the same time, ions in the doped fiber are energized using pump light, which is provided at a different wavelength from a pump laser diode. Photons of the optical signal interact with the energized ions, causing the ions to give up some of their energy in the form of photons at the same wavelength as the photons of the optical signal, with the ions returning to a lower energy state. The optical signal is thereby amplified as it passes through the doped fiber.

For example, an Erbium doped fiber amplifier (EDFA) can be used in an optical fiber link to amplify signals at low loss in a 1550-nm wavelength range of the fiber. In the EDFA, a short length (few meters) of the optical fiber is doped with the rare-earth element erbium. A pump laser injects light into the erbium-doped fiber at a given wavelength to excite the erbium ions in the fiber. Energy is transferred to the optical signal passing through the fiber when the excited ions return to an unexcited state. The wavelength to be amplified can be in the 1550-nm range, and the wavelength of the pump laser can be 980 and/or 1480 nm.

In many fiber amplifiers, multiple pump laser injections are required within the optical topology. In addition, there are more requirements where multiple EDFA are required in a single physical location. Convention is to use a single pump laser chip per injection point or per gain stage for cost efficiency, but there are common cases where more than one pump laser may be beneficial. This chip may be individually packaged or multiple chips may be included in one pump laser package. This works well, but there are always limits on the smallest size that a fiber amplifier can be due to the number of optical components required in a gain stage. In addition, costs will be higher the more optical components are needed.

The subject matter of the present disclosure is directed to overcoming, or at least reducing the effects of, one or more of the problems set forth above.

SUMMARY OF THE DISCLOSURE

According to the present disclosure, a fiber amplifier is operable with an electric drive signal for amplifying signal light having a signal wavelength. The apparatus comprises a laser diode and a doped filer. The laser diode has an active section and has an input facet and an output facet. The input and output facets are in optical communication with the signal light and are configured to pass the signal light through the laser diode from the input facet to the output facet. The active section is configured to generate pump light in response to injection of the electrical drive signal into the active section. The pump light has a pump wavelength different from the input wavelength.

The fiber is doped with an active dopant. The fiber is in optical communication with the signal light and is in optical communication with at least a portion of the pump light from the laser diode. For example, the doped fiber can be downstream of the laser diode's output facet in a co-pumping arrangement, or the doped fiber can be upstream of the laser diode's input facet in a backward pumping arrangement. Other configurations are possible. Either way, the pump wavelength of the pump light is configured to interact with the active dopant of the fiber and thereby amplify the signal light.

According to the present disclosure, a method is used with signal light having a signal wavelength. The method comprises: receiving the signal light at an input facet of a laser diode; passing the signal light from the input facet through the laser diode to an output facet; generating pump light in an active section of the laser diode by injecting an electrical drive signal into the active section of the laser diode, the pump light having a pump wavelength different from the signal wavelength; transmitting the signal light and at least a portion of the pump light to a doped fiber amplifier in optical communication with the laser diode; and amplifying the signal light by interacting the pump light with the doped fiber amplifier.

The foregoing summary is not intended to summarize each potential embodiment or every aspect of the present disclosure.

DETAILED DESCRIPTION OF THE DISCLOSURE

Figure 1:
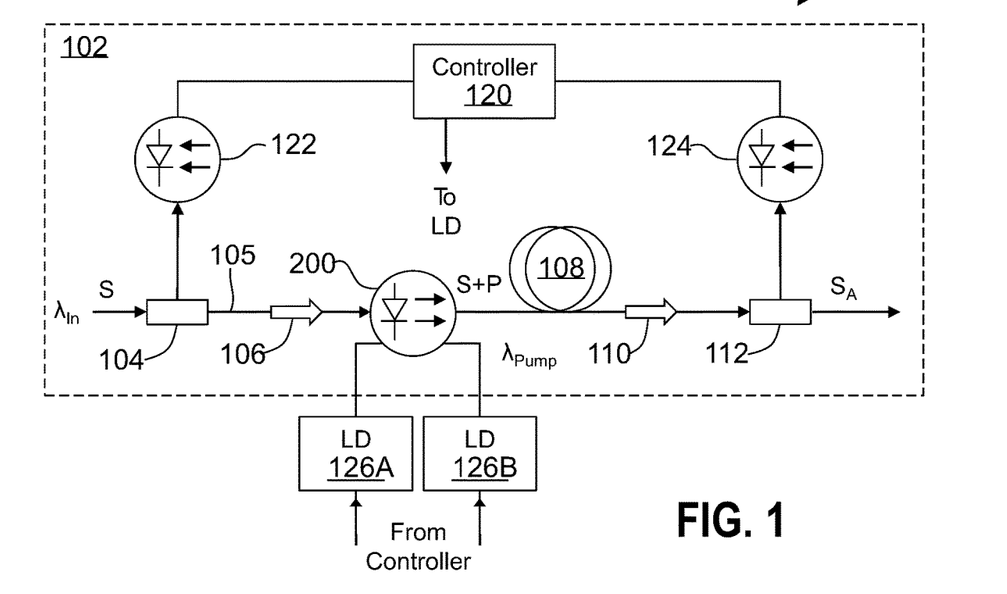
FIG. 1 illustrates an apparatus having a doped fiber amplifier and a pass-through pump laser according to the present disclosure.

FIG. 1 illustrates a fiber amplifier system 100 having a fiber amplifier 102 with a pass-through laser diode 200 according to the present disclosure. The laser diode 200 is disposed in a path 105 of input or primary signal light S and is configured to pass signal light S received at an input facet through the laser diode 200 to an output facet, while also generating and outputting pump light P. Together, the signal light S and at least a portion of the pump light P are transmitted from the output facet into the path 105 toward a doped fiber 108. For example, at least a portion of the input signal light S that reaches the input end facet of the laser diode 200 and passes into the laser diode 200, where the input signal light S is combined with at least some of the pump light P added by the laser diode 200. The combined portions of signal and pump light S+P reach the output end facet to be transmitted through the end facet to an optical fiber of the path 105 to then propagate to the doped fiber 108.

As disclosed herein, configuring the laser diode 200 to receive the input signal light S and to output the received input signal light S and the added pump light P from one end facet may eliminate the need for some of the conventional components required for a pump laser of a fiber amplifier. Namely, there is no need for a coupler, such as a dichroic coupler, to be used to couple pump light into the optical path of input signal light.

The fiber amplifier 102 of the present disclosure uses the pass-through laser diode 200 having an active section positioned between two end facets, each of which has low reflectivity. For example, each of the end facets may have an anti-reflection (AR) coating. Details related to a two-facet laser diode that can be used for the pass-through laser diode 200 are disclosed in co-pending U.S. application Ser. No. 16/947,643, filed 11 Aug. 2020 and entitled "DUAL OUTPUT LASER DIODE," which is incorporated herein by reference in its entirety.

The pass-through laser diode 200 disclosed herein can be used with a number of fiber amplifier systems 100, such as an erbium-doped fiber amplifier (EDFA) system or other systems. For example, the fiber amplifier 102 can include one or more glass fibers 108 that are doped with rare earth ions. Some example dopants include erbium, neodymium, ytterbium, praseodymium, bismuth, holium, or thulium. For these dopants, pump light P from the laser diode 200 propagates through the fiber core of the doped fiber 108 along with the primary signal S to be amplified, and the pump light P provides energy to the active dopant.

A maximum optical power density within the laser diode 200 may be reduced by a factor of about two because no pump light P or relatively little pump light P is reflected at one end facet back to the other as occurs in conventional laser diodes having an AR coating at one end facet and an HR coating at the other. However, it should be noted that the reduced maximum optical power density of the pass-through laser diode 200 according to the present disclosure may have increased reliability when compared to laser diodes having AR and HR coatings at opposite end facets.

Depending on the desired implementation, the pass-through laser diode 200 may have equal or unequal reflectivities at the opposing facets. For example, AR coatings of unequal reflectivity can be used at the end facets, such as a first AR coating with a reflectivity of 1% at a first end facet and a second AR coating with a reflectivity of 0.75% at a second end facet. Alternatively or additionally, a waveguide of the laser diode 200 can be structured to have different transmissivities at or near the two end facets, such as a transmissivity of 99.5% for a portion of the waveguide near the first end facet and a transmissivity of 99% for a portion of the waveguide near the second end facet. These percentage values are only exemplary and can be varied depending on the implementation.

Alternatively or additionally, first and second portions of the laser diode 200 can be controlled differently. For example, the laser diode 200 may include a first anode and cathode electrically coupled to a first portion of the laser diode 200 and can include a second anode and cathode electrically coupled to a second portion of the laser diode 200. An etched mirror, a distributed feedback (DFB) mirror, or other reflective structure may be formed in the laser diode 200 between the first and second portions to at least partially isolate optical communication of the pump light P from one of the first and second portions to the other. Accordingly, the first and second portions of the laser diode 200 may be independently operated while being integrally formed in a single structure.

To monitor operation, the fiber amplifier system 100 can include an input optical tap 104 communicating with an input photodiode 122 connected to a controller 120. Likewise, an output optical tap 112 can communicate with an output photodiode 124 connected to the controller 120 at the output end. A first optical isolator 106 can be used between the laser diode 200 and the input optical tap 104, and a second optical isolator 110 can be used between the laser diode 200 and the doped fiber 108. In general, the fiber amplifier 102 is configured to receive pass-through optical signal light S as input and is configured to output amplified signal light SA that is an amplified version of the optical signal light S.

In more detail, the pass-through optical signal light S is received at the input tap 104. This signal light S can be generated by a suitable source (not shown), depending on the implementation. A small portion (e.g., 2%) of the signal light S can be directed by the input tap 104 to the input photodiode 122, which can measure optical power of the optical signal light S. A remainder (e.g., 98%) of the pass-through optical signal light S passes through the input tap 104 and the first isolator 106 to the laser diode 200. The first isolator 106 may prevent or at least reduce back reflection.

The pass-through optical signal light S has a first input wavelength $\lambda_{In}$. The laser diode 200 pumps pump light P at a second pump wavelength $\lambda_{Pump}$ selected to provide optical amplification to the corresponding optical signal light S operating at λin in the presence of a specific rare-earth dopant within the doped fiber 108. The dopant may be erbium, ytterbium, or other dopant. When the dopant is erbium, for example, the wavelength $\lambda_{Pump}$ of the pump light P emitted by the laser diode 200 may be about 980-nanometers (nm) (e.g., 970-nm to 990-nm). The pump light P at the pump wavelength $\lambda_{Pump}$ of about 980-nm can be configured to provide amplification in the doped fiber 108 to the optical signal light S when its wavelengths λin is about 1550-nm, such as wavelengths in the C band (~1528 nm to 1568 nm), or about 1590-nm, such as wavelengths in the L band (~1568 nm to 1625 nm).

The laser diode 200 outputs the optical signal light S combined with at least a portion the pump light P to the doped fiber 108. Ideally, all or at least most of the pump light P is injected into the doped fiber 108, but the amount may be a proportion of the total possible power that the laser diode 200 can emit as some of the 980-nm pump light P may be lost. The pump light P at the pump wavelength $\lambda_{Pump}$ energizes ions in the doped fiber 108, and the signal light S at the input wavelength $\lambda_{In}$ interacts with the energized ions. In particular, photons of the signal light S at the input wavelength $\lambda_{In}$ stimulate emission of photons from the energized ions at the input wavelength $\lambda_{In}$ to generate the amplified signal light SA.

The amplified signal light SA passes through the second isolator 110 and can pass to the output tap 112. If used, the output tap 112 directs a small portion of the amplified signal light SA to the output photodiode 124, which can measure optical power of the amplified signal light SA. The remainder of the amplified signal light SA passes through the output tap 112 and is output from the fiber amplifier 102.

The controller 120 can control one or more laser drivers 126A-B for the laser diode 200. In particular, the controller 120 can monitor the input and output signals using the input and output photodiodes 122 and 124 and can control the one or more laser drivers 126A-B, which apply electrical drive signal(s) to the laser diode 200 as directed by the controller 120. In turn, the electrical drive signal(s) may dictate the optical power of the pump light P emitted by the laser diode 200. For example, the laser 200 may emit pump light P with an optical power that is proportional to or has some other defined relationship to current of the electrical drive signal (s).

During operation, the controller 120 can compare the optical power of the signal light S (measured by the input photodiode 122) to the optical power of the amplified signal light SA (measured by the output photodiode 124) to determine gain of the fiber amplifier 102. If the gain is above or below a target gain, the one or more laser drivers 126A-B can adjust the electrical drive signal(s) to increase or decrease the gain of the fiber amplifier 102. As discussed in more detail later, the laser diode 200 can include two portions that may be independently controlled by a corresponding one of the laser drivers 126A-B to independently control gain in the fiber amplifiers 102.

Having an understanding of a fiber amplifier system 100 of the present disclosure, discussion turns to further details of a fiber amplifier 102 of the present disclosure.

Figure 2A:
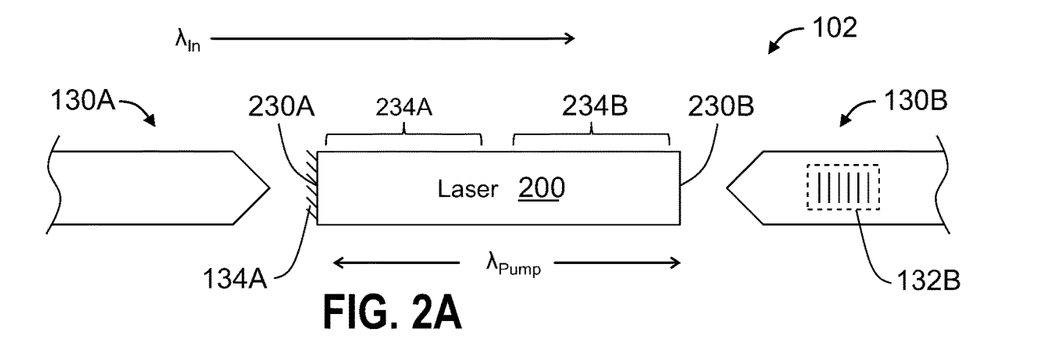
FIG. 2A illustrates a portion of the apparatus of FIG. 1 that includes the pass-through laser diode and input and output optical fibers.

FIG. 2A illustrates a portion of the fiber amplifier 102 of FIG. 1 that includes the pass-through laser diode 200, an input optical fiber 130A, and an output optical fiber 130B. The input and output optical fibers 130A-B may include, be included in, or correspond to the optical path 105 of FIG. 1.

As illustrated in FIG. 2A, the laser diode 200 includes two end facets 230A-B spaced apart from each other. The input end facet 230A has low reflectivity at least for the pass-through signal's wavelength $\lambda_{In}$ (or multiple wavelengths or a range of wavelengths associated with the pass-through signal wavelength $\lambda_{In}$). The input facet 230A further has high reflectivity at least for the laser diode's operational wavelength $\lambda_{Pump}$ (or multiple wavelengths or a range of wavelengths associated with the laser diode's operational wavelength $\lambda_{Pump}$). This can be achieved using a high reflection mirror 134A on the input end facet 230A. For example, the mirror 134A can include a high reflection (HR) facet coating having multiple thin film layers that include materials of different refractive indices and that have a thickness fractioned to a wavelength of interest.

Meanwhile, the output end facet 230B has low reflectivity for multiple wavelengths or a range of wavelengths, such as those wavelengths for the laser diode's operational wavelength $\lambda_{Pump}$ and the pass-through signal wavelength $\lambda_{In}$. The reflectivities referenced may be (or may include) reflectivity for a single wavelength, multiple wavelengths, or a range of wavelengths, such as an operational wavelength range of the laser 200. The operational wavelength range may include wavelengths suitable for pump light (P), such as wavelengths of about 980-nm or other wavelengths. In some configurations, the operational wavelength range may be from 970-nm to 990-nm, or from 975-nm to 985-nm, or other suitable range.

The input and output optical fibers 130A-B are positioned so that each of the corresponding end facet 230A-B is optically coupled to the corresponding optical fiber 130A-B. For example, the first end facet 230A is optically coupled to the input optical fiber 130A, and the second end facet 230B is optically coupled to the output optical fiber 130B using suitable forms of optical coupling. For example, each optical fiber 130A-B may be optically aligned to the corresponding end facet 230A-B and positioned sufficiently close to the corresponding end facet 230A-B so that light is properly coupled one to the other. Alternatively or additionally, one or more optical elements, such as one or more lenses or other optical elements, may be positioned between the end facet 230A-B and the optical fiber 130A-B. Various types of optical coupling can be used.

The output optical fiber 130B may include a fiber Bragg grating (FBG) 132B formed therein. The FBG 132B may be configured for one or more wavelengths. The FBG 132B may be configured to reflect a portion, e.g., 2-4%, of the pump light (P) back to the laser diode 200. The FBG 132B may be configured to reflect back a predetermined wavelength or multiple predetermined wavelengths which may "lock" the laser diode 200 to the predetermined wavelength (s) so that the laser diode 200 exhibits stable lasing at the predetermined wavelength(s).

The FBG 132B may be configured to reflect back one or more wavelengths (e.g., 974-nm and 976-nm), but can pass the higher wavelength $\lambda_{Pump}$ of the signal light (S). The reflected light may be coupled through the second end facet 230B into the laser 200 where it interacts generally with a second portion 234B of the laser 200 such that the second portion 234B of the laser 200 is locked to both 974-nm and 976-nm.

More generally, the FBG 132B may lock corresponding first or second portion 234A, 234B of the laser 200 to one or multiple predetermined wavelength(s). In other arrangements, the laser diode 200 itself may include a DFB structure to lock the laser 200 to a predetermined wavelength(s) so that the FBG 132 may be omitted.

In some configurations, the FBG 132B forms a fiber cavity with the laser diode 200, where the FBG 132B provides sufficient reflectivity to ensure lasing of the laser diode 200. Alternatively or additionally, the laser diode 200 may include a ridge structure as described with respect to FIG. 3. Roughness of the ridge structure, thermal induced refractive changes, or gain induced refractive changes along the length of the laser diode 200 may reflect and scatter light generated in the laser diode 200 sufficiently to build up the optical field and ensure lasing of the laser diode 200. In some arrangements, the laser diode 200 may have a higher threshold or gain for lasing than other lasers in view of the low reflectivity at the end facets 230A-B.

Either way, the laser diode 200, the reflectivity of the input facet 230A, the FBG 132B, and the like are transparent to the higher wavelength $\lambda_{In}$ of the input signal light S that passes through an active section of the laser diode 200. In this way, the pass-through input signal light S at the higher wavelength $\lambda_{In}$ and at least a portion of the pump light P at the lower wavelength $\lambda_{Pump}$ can be transmitted through the output facet 230B to propagate onward to the fiber amplifier (102). As already disclosed in one implementation, the pass-through wavelength $\lambda_{In}$ can be about 1550-nm and the pump wavelength $\lambda_{Pump}$ can be 980-nm, when the fiber amplifier (102) uses an erbium doped fiber (108).

The arrangement in FIG. 2A is well suited for a pump and amplifier topology in which the pass-through pump has the gain medium downstream of the pump. Details of such an arrangement are described below with respect to FIG. 4A, for example. Other arrangements are possible.

Figure 2B:
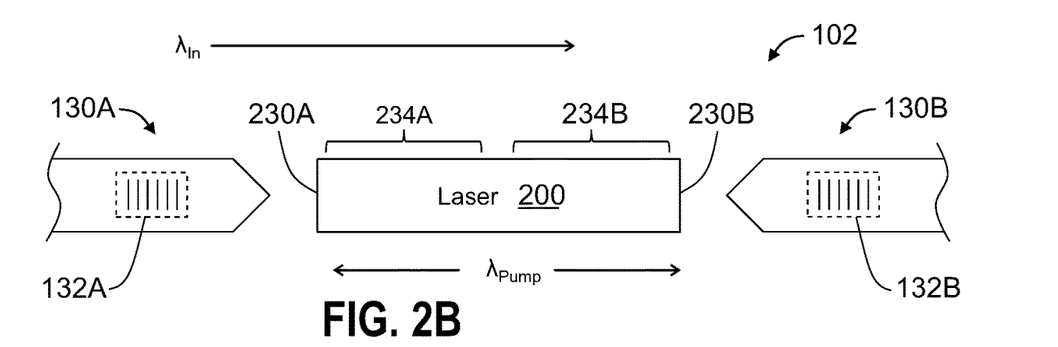
FIG. 2B illustrates a portion of the apparatus of FIG. 1 that includes the pass-through laser diode and input and output optical fibers.

As another example, FIG. 2B illustrates a portion of the fiber amplifier 102 of FIG. 1 that includes another configuration of the pass-through laser diode 200, the input optical fiber 130A, and the output optical fiber 130B. The input and output optical fibers 130A-B may include, be included in, or correspond to the optical path 105 of FIG. 1.

As illustrated again in FIG. 2B, the laser diode 200 includes the two end facets 230A-B spaced apart from each other. Each of the end facets 230A-B has low reflectivity. The reflectivity may be or include reflectivity for a single wavelength, multiple wavelengths, or a range of wavelengths, such as an operational wavelength range of the laser 200. The operational wavelength range may include wavelengths suitable for pump light (P), such as wavelengths of about 980-nm or other wavelengths. In some configurations, the operational wavelength range may be from 970-nm to 990-nm, or from 975-nm to 985-nm, or other suitable range.

The input and output optical fibers 130A-B are positioned so that each of the corresponding end facet 230A-B is optically coupled to the corresponding optical fiber 130A-B. For example, the first end facet 230A is optically coupled to the input optical fiber 130A, and the second end facet 230B is optically coupled to the output optical fiber 130B using suitable forms of optical coupling. For example, each optical fiber 130A-B may be optically aligned to the corresponding end facet 230A-B and positioned sufficiently close to the corresponding end facet 230A-B so that light is properly coupled one to the other. Alternatively or additionally, one or more optical elements, such as one or more lenses or other optical elements, may be positioned between the end facet 230A-B and the optical fiber 130A-B. Various types of optical coupling can be used.

In this configuration, each of the optical fibers 130A-B may include a fiber Bragg grating (FBG) 132A-B formed therein. The input FBG 132A may be configured for a first wavelength, while the output FBG 132B may be configured for the first wavelength and a second wavelength. The FBGs 132A-B may be configured to reflect a portion, e.g., 2-4%, of the pump light (P) back to the laser diode 200. Each FBG 132A-B may be configured to reflect back a predetermined wavelength or multiple predetermined wavelengths which may "lock" the laser diode 200 to the predetermined wavelength(s) so that the laser diode 200 exhibits stable lasing at the predetermined wavelength(s). The FBGs 132A-B may be configured to reflect back the same or different predetermined wavelength(s), to cause the laser diode 200 to emit pump light (P) from the output end facet 230B at at least two predetermined wavelengths.

For example, the first FBG 132A may be configured to reflect back a first wavelength of 974-nm, but can pass the higher wavelength of the signal light (S). The reflected light may be coupled through the first end facet 230A into the laser 200 where it interacts generally with a first portion 234A of the laser 200 such that the first portion 234A of the laser 200 is locked to 974 nm.

The second FBG 132B may be configured to reflect back both the first wavelength of 974-nm and a second wavelength of 976-nm, but can pass the higher wavelength of the signal light (S). The reflected light may be coupled through the second end facet 230B into the laser 200 where it interacts generally with a second portion 234B of the laser 200 such that the second portion 234B of the laser 200 is locked to both 974-nm and 976-nm.

More generally, each FBG 132A-B may lock the corresponding first or second portion 234A, 234B of the laser 200 to one or multiple predetermined wavelength(s). In other arrangements, the laser diode 200 itself may include a DFB structure to lock the laser 200 to a predetermined wavelength(s) so that the FBGs 132 may be omitted.

In some configurations, each of the FBGs 132A-B forms a fiber cavity with the laser diode 200, where the FBGs 132A-B provides sufficient reflectivity to ensure lasing of the laser diode 200. Alternatively or additionally, the laser diode 200 may include a ridge structure as described with respect to FIG. 3. Roughness of the ridge structure, thermal induced refractive changes, or gain induced refractive changes along the length of the laser diode 200 may reflect and scatter light generated in the laser diode 200 sufficiently to build up the optical field and ensure lasing of the laser diode 200. In some arrangements, the laser diode 200 may have a higher threshold or gain for lasing than other lasers in view of the low reflectivity at the end facets 230A-B.

Either way, the laser diode 200, the FBGs 132A-B, and the like are transparent to the higher wavelength $\lambda_{In}$ of the input signal light S that passes through an active section of the laser diode 200. In this way, the pass-through input signal light S at the higher wavelength $\lambda_{In}$ and at least a portion of the pump light P at the lower wavelength $\lambda_{Pump}$ can be transmitted through the output facet 230B to propagate onward to the fiber amplifier (102). As already disclosed in one implementation, the pass-through wavelength $\lambda_{In}$ can be about 1550-nm and the pump wavelength $\lambda_{Pump}$ can be 980-nm, when the fiber amplifier (102) uses an erbium doped fiber (108).

The arrangement in FIG. 2B is well suited for a pump and amplifier topology in which the pass-through pump has the gain medium upstream and downstream of the pump. Details of such an arrangement are described below with respect to FIG. 4B, for example.

Figure 3:
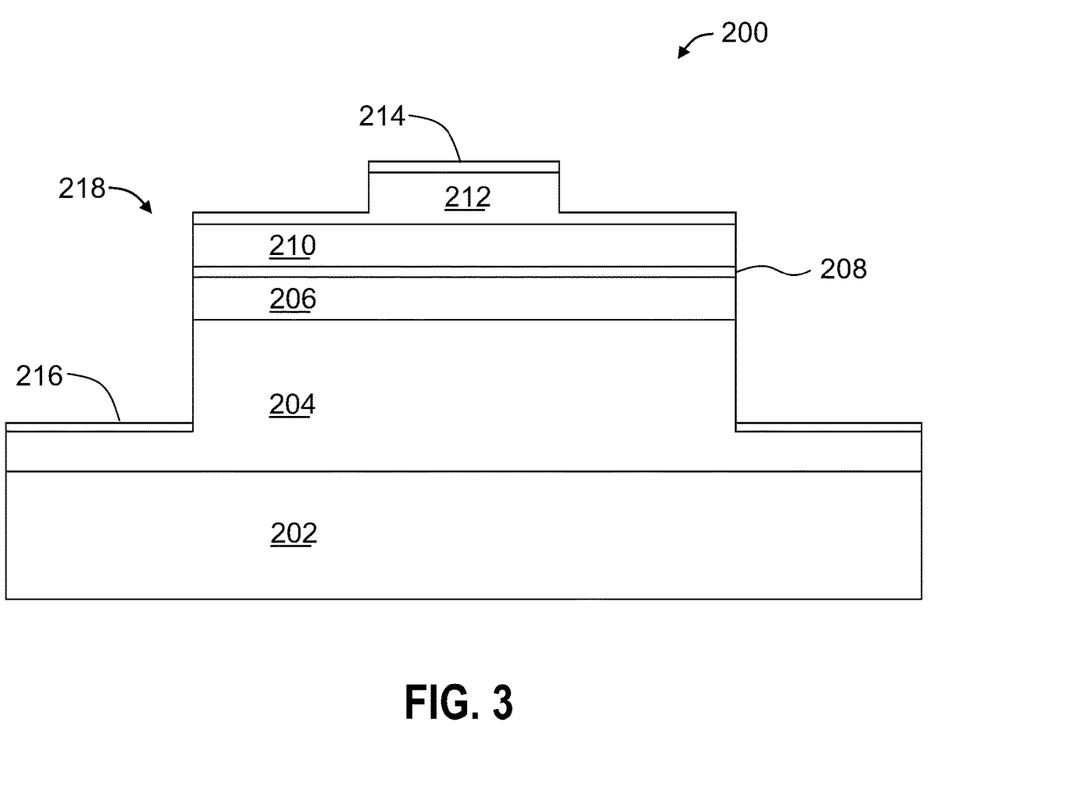
FIG. 3 illustrates an end-section of a pass-through laser diode.

FIG. 3 shows an end-section of a pass-through laser diode 200 according to the present disclosure. The laser diode 200 may include, be included in, or correspond to any of the laser diodes disclosed herein. The end-sectional view of FIG. 3 is in a plane that is parallel to end facets (230A-B) of the laser diode 200 and perpendicular to a light emission direction of the laser diode 200. The light emission direction is in and out of the page in FIG. 3, and this direction is also referred to as a longitudinal direction.

As illustrated in FIG. 3, the laser diode 200 includes various epitaxial layers, such as a substrate 202, a lower cladding layer 204, a lower waveguide layer 206, an active layer 208, an upper waveguide layer 210, an upper cladding layer 212, a cathode 214, and an anode 216. The laser diode 200 may include additional or different layers or elements than illustrated in FIG. 3 in other arrangements. The end facets (230A-B) of the laser 200 may be formed in the epitaxial layers, e.g., by cleaving through the epitaxial layers.

The configuration of FIG. 3 includes the active layer 208 with multiple quantum wells (MQWs) embedded in the lower and upper waveguide layers 206, 210 and surrounded by the lower and upper cladding layers 204, 212. These cladding layers 204, 212 are configured to confine the optical mode in a transversal direction, e.g., vertically in FIG. 3.

The laser diode 200 can also include a mesa or ridge structure 218 to confine the optical mode in a lateral direction, e.g., horizontally in FIG. 3. The ridge structure 218 with lower and upper waveguide layers 206, 210 and lower and upper cladding layers 204, 212 forms a waveguide that extends longitudinally, e.g., in and out of the page in FIG. 3, between end facets (230A-B) of the laser diode 200. In the pass-through laser diode 200. This waveguide is configured to guide the input signal light (S) and to guide the pump light (P) generated by the laser diode 200 longitudinally.

The active layer 208 may extend longitudinally for all or a portion of a length (e.g., in and out of the page in FIG. 3) of the laser diode 200. Alternatively or additionally, the anode 216 may extend longitudinally for all or a portion of the length of the laser diode 200 and the anode 216 may have a region in which current is injected (referred to as a current injection region) that may extend longitudinally for all or a portion of a length of the anode 216. A length of the current injection region may determine a longitudinal extent of stimulated emission of pump light (P) within the laser diode 200.

As disclosed herein, a portion of the laser diode 200 that extends longitudinally along the length of the active layer 208, the length of the anode 216, or the length of the current injection region of the anode 216 may be referred to as an "active section" of the laser diode 200. For the pass-through of the input signal light (S), the active section of the laser diode 200 extends longitudinally from one end facet to the other.

The cathode 214 and the anode 216 are electrically coupled to opposite sides of the active section. In the example of FIG. 3, the cathode 214 and the anode 216 are electrically coupled in particular to a bottom and top of the active section of the laser diode 200. A laser driver, such as the laser driver 126 of FIG. 1, may be coupled to the anode 216 to inject an electrical drive signal into and through the laser diode 200 to the cathode 214. The electrical drive signal may cause electrons and holes to be injected from opposite sides into the active layer 208 where they recombine via stimulated emission to generate photons for the pump light (P).

Having an understanding of a pass-through laser diode 200 used in a fiber amplifier 102 as discussed above, discussion now turns to particular configurations.

Figure 4A:
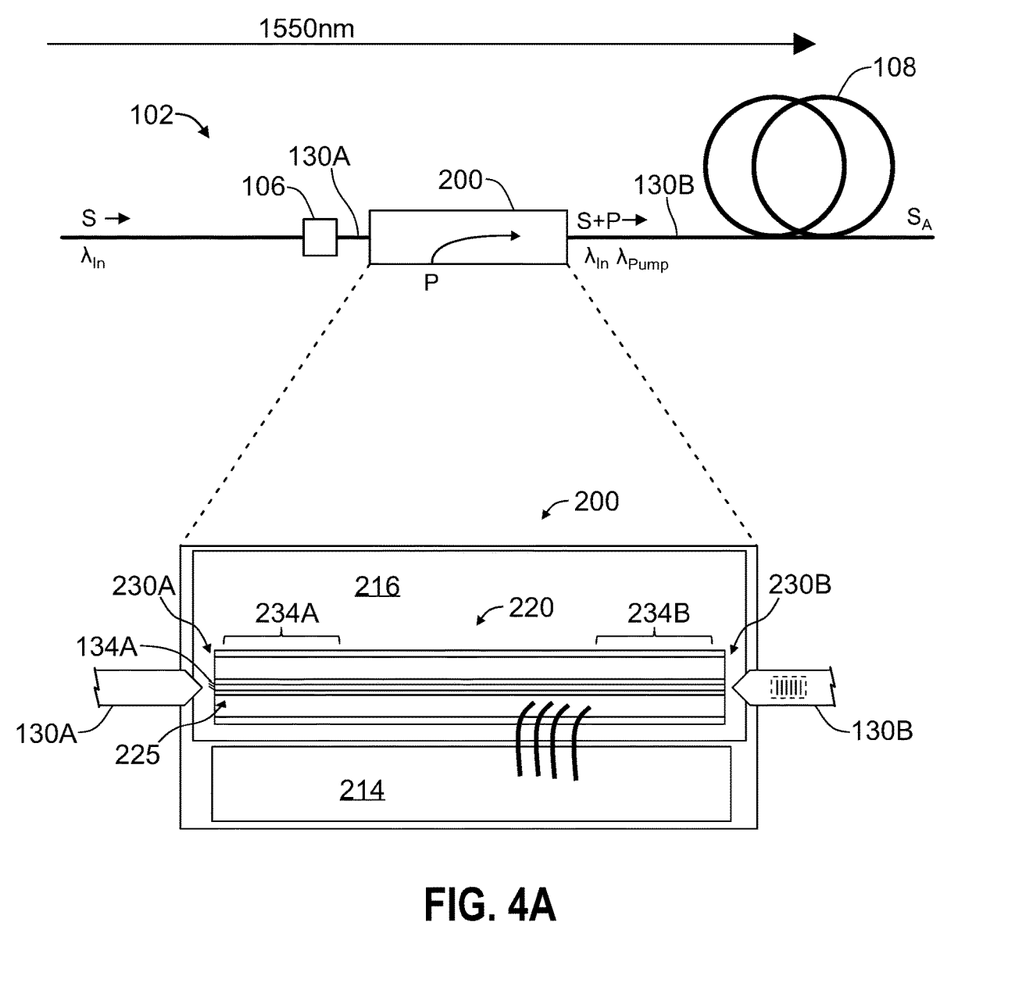
FIG. 4A illustrates a fiber amplifier having a doped fiber and one configuration of a pass-through pump laser.

FIG. 4A is a top schematic view of a laser diode 200 arranged for pass-through in a fiber amplifier 102 according to the present disclosure. As illustrated in FIG. 4A, the laser diode 200 includes an input facet 230A, an output facet 230B, and an active section 220 positioned between the facets 230A-B.

In general, the active section 220 is configured to generate pump light P that propagates toward each of the facets 230A-B. The pump light P is generated by the active section 220 in response to injection of an electrical drive signal into the active section 220. A cathode 214 and an anode 216 are electrically coupled to opposite sides, e.g., a top and a bottom, of the active section 220 to inject the electrical drive signal into the active section 220 between the cathode 214 and the anode 216.

The input and output facets 230A-B have low reflectivity at least for the pass-through signal wavelength $\lambda_{In}$, while the input facet 230A has a high reflectivity at least for the operational wavelength $\lambda_{Pump}$ of the diode 200. In an example, the reflectivity at each of the end facets 230A-B is achieved by cleaving the laser diode 200 from a wafer of lasers and forming an appropriate AR/HR coating on the cleaved end facets 230A-B. As noted previously with reference to FIG. 2A, the input end facet 230A can include an HR coating 134A to reflect the wavelength $\lambda_{Pump}$ of the pump light (P), but to pass the higher wavelength $\lambda_{In}$ of the signal light (S).

The input end facet 230A is configured to transmit a portion, such as a majority, of the pass-through input signal light S (at the input wavelength $\lambda_{In}$) into the active section 220, and the output end facet 230B is configured to transmit a portion, such as a majority, of that input signal light S along with a portion, such as half or more, of the pump light P at a pump wavelength $\lambda_{Pump}$ out of the active section 220.

For example, the end facet 230B may be configured to transmit at least 95%, 97%, or 99% of the light that reaches the end facets 230A-B through the end facet 230A-B. In these and other configurations, the end facet 230B may have a reflectivity less than 1%. The reflectivity may be or include reflectivity for a single wavelength, multiple wavelengths, or a range of wavelengths such as an operational wavelength range of the laser diode 200. The operational wavelength range of the laser diode 200 may be the same as or different than other operational wavelength ranges described herein. The output end facet 230B is configured to transmit a portion of the pump light P generated by the active section 220 as well as a majority of the input signal light S that reaches the output end facet 230B through the end facet 230B.

In some embodiments as already noted, the reflectivity of the input end facet 230A is different than the reflectivity of the output end facet 230B for given wavelengths. Accordingly, the optical power of light at the end facets 230A-B may be different. For example, the laser diode 200 may be configured so that more of the pump light P is output at the output end facet 230B than the input facet 230A in arrangements where the doped fiber 108 is arranged toward the output end facet 230B, such as shown here in FIG. 4A.

The active section 220 includes a waveguide 225 that extends between the end facets 230A-B. The waveguide 225 may include the waveguide layers and the like as described with respect to FIG. 3. A first portion 234A of the waveguide 225 near the input end facet 230A may have a first transmissivity at least for the pump wavelength $\lambda_{Pump}$, and a second portion 234B of the waveguide 225 near the output end facet 230B may have a second transmissivity at least for the pump wavelength $\lambda_{Pump}$. The first and second transmissivities may each be (or may include) transmissivity for a single wavelength, multiple wavelengths, or a range of wavelengths, such as the operational wavelength range of the laser diode 200.

The first and second transmissivities of the first and second portions 234A, 234B of the waveguide 225 may be the same or different. The first and second transmissivities may depend on materials and structure of the first and second portions 234A-B of the waveguide 225. Accordingly, the materials or structure of the first and second portions 234A-B of the waveguide 225 may be selected to output light with equal or different optical power from the end facets 230A-B, as desired.

As further shown in FIG. 4A, the pass-through pump laser diode 200 is used in a fiber amplifier system having a fiber amplifier 102 with a doped fiber 108. The input facet 230A is in optical communication with the input signal light S and is configured to receive the input light S, such as from an input fiber 130A. The active section 220 of the diode 200 is configured to pass the input light S from the input facet 230A to the output facet 230B. The active section 220 is configured to generate pump light P in response to injection of the electrical drive signal into the active section 220. The pump light P has a pump wavelength $\lambda_{Pump}$ different from the input wavelength $\lambda_{In}$ that passes through the diode 200.

The fiber amplifier 102 has a fiber portion 130B and the doped fiber 108. The fiber portion 130B is in optical communication with the output facet 230B and is configured to receive the input light S and at least a portion of the pump light P from the output facet 230B. The pump wavelength $\lambda_{Pump}$ of the pump light P is configured to interact with the doped fiber 108 in the manner disclosed herein.

Figure 4B:
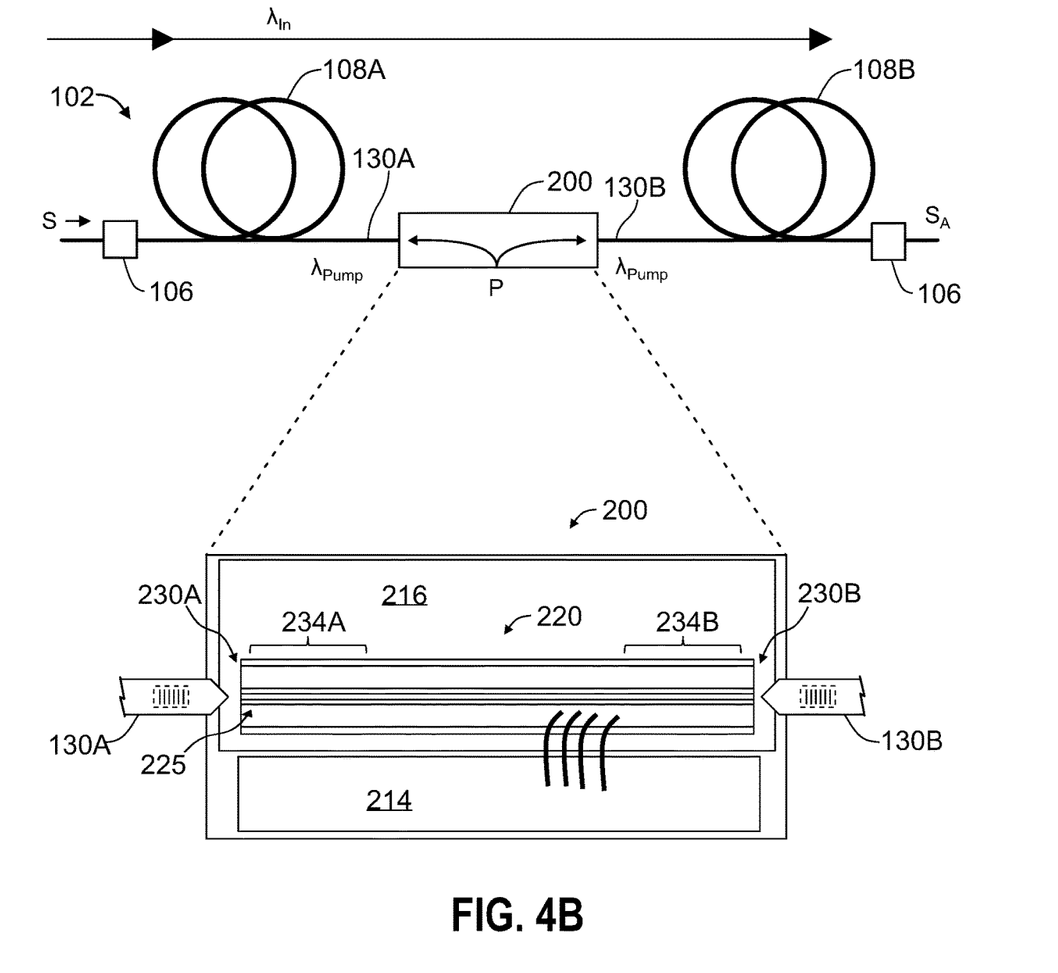
FIG. 4B illustrates a fiber amplifier having a doped fiber and another configuration of a pass-through pump laser.

In another configuration, FIG. 4B is a top schematic view of a laser diode 200 arranged for pass-through in a fiber amplifier 102 according to the present disclosure. As illustrated in FIG. 4B, the laser diode 200 includes an input facet 230A, an output facet 230B, and an active section 220 positioned between the facets 230A-B.

The fiber amplifier 102 has the laser diode 200 and doped fibers 108A-B arranged in forward and backward pumping directions in which a first portion of the pump light P co-propagates with the primary signal light S through one doped fiber 108B and in which a second portion of the pump light P propagates against the primary signal light S through another doped fiber 108A. As noted, the laser diode 200 allows the primary signal light S being amplified to pass-through. As also noted, the laser diode 200 generates a pump light P that may pass in both directions. Yet, the laser diode 200, the reflectivities of its facets (230A-B), the transmissivities of with waveguide (220), its multiple active regions, etc. can be configured to pass more, less, or equal portions of pump light P in forward and backward directions as desired. This is merely schematically shown in FIG. 4B. In any event, the pump light P directed to the doped fiber 108 can amplify the signal light S.

In general, the active section 220 is configured to generate pump light P that propagates toward each of the facets 230A-B. The pump light P is generated by the active section 220 in response to injection of an electrical drive signal into the active section 220. A cathode 214 and an anode 216 are electrically coupled to opposite sides, e.g., a top and a bottom, of the active section 220 to inject the electrical drive signal into the active section 220 between the cathode 214 and the anode 216.

The input and output facets 230A-B have low reflectivity. In an example, the low reflectivity at each of the end facets 230A-B is achieved by cleaving the laser diode 200 from a wafer of lasers and forming an AR coating on the cleaved end facets 230A-B.

The input end facet 230A is configured to transmit a portion, such as a majority, of the pass-through input signal light S (at the input wavelength $\lambda_{In}$) into the active section 220, and the output end facet 230B is configured to transmit a portion, such as a majority, of that input signal light S along with a portion, such as half or more, of the pump light P at a pump wavelength $\lambda_{Pump}$ out of the active section 220.

For example, the end facets 230A-B may be configured to transmit at least 95%, 97%, or 99% of the light that reaches the end facets 230A-B through the end facet 230A-B. In these and other configurations, the end facets 230A-B may have a reflectivity less than 1%. The reflectivity may be or include reflectivity for a single wavelength, multiple wavelengths, or a range of wavelengths such as an operational wavelength range of the laser diode 200. The operational wavelength range of the laser diode 200 may be the same as or different than other operational wavelength ranges described herein. The output end facet 230B is configured to transmit a portion of the pump light P generated by the active section 220 as well as a majority of the input signal light S that reaches the output end facet 230B through the end facet 230B.

In some embodiments and as already noted, the reflectivity of the input end facet 230A is different than the reflectivity of the output end facet 230B. Accordingly, the optical power of light at the end facets 230A-B may be different. For example, the laser diode 200 may be configured so that more of the pump light P is output at the output end facet 230B than the input facet 230A in arrangements where the doped fiber 108 is arranged toward the output end facet 230B.

The active section 220 includes a waveguide 225 that extends between the end facets 230A-B. The waveguide 225 may include the waveguide layers and the like as described with respect to FIG. 3. A first portion 234A of the waveguide 225 near the input end facet 230A may have a first transmissivity at least for the pump wavelength $\lambda_{Pump}$, and a second portion 234B of the waveguide 225 near the output end facet 230B may have a second transmissivity at least for the pump wavelength $\lambda_{Pump}$. The first and second transmissivities may each be or include transmissivity for a single wavelength, multiple wavelengths, or a range of wavelengths such as the operational wavelength range of the laser diode 200.

The first and second transmissivities of the first and second portions 234A, 234B of the waveguide 225 may be the same or different. The first and second transmissivities may depend on materials and structure of the first and second portions 234A-B of the waveguide 225. Accordingly, the materials or structure of the first and second portions 234A-B of the waveguide 225 may be selected to output light with equal or different optical power from the end facets 230A-B, as desired.

As further shown in FIG. 4B, the pass-through pump laser diode 200 of FIG. 4B is used in a fiber amplifier system having a fiber amplifier 102 with a doped fiber 108. The input facet 230A is in optical communication with the input signal light S and is configured to receive the input light S, such as from an input fiber 130A. The active section 220 of the diode 200 is configured to pass the input light S from the input facet 230A to the output facet 230B. The active section 220 is configured to generate pump light P in response to injection of the electrical drive signal into the active section 220. The pump light P has a pump wavelength $\lambda_{Pump}$ different from the input wavelength $\lambda_{In}$ that passes through the diode 200.

The fiber amplifier 102 has a fiber portion 130B and the doped fiber 108. The fiber portion 130B is in optical communication with the output facet 230B and is configured to receive the input light S and at least a portion of the pump light P from the output facet 230B. The pump wavelength $\lambda_{Pump}$ of the pump light P is configured to interact with the doped fiber 108 in the manner disclosed herein.

Figure 4C:
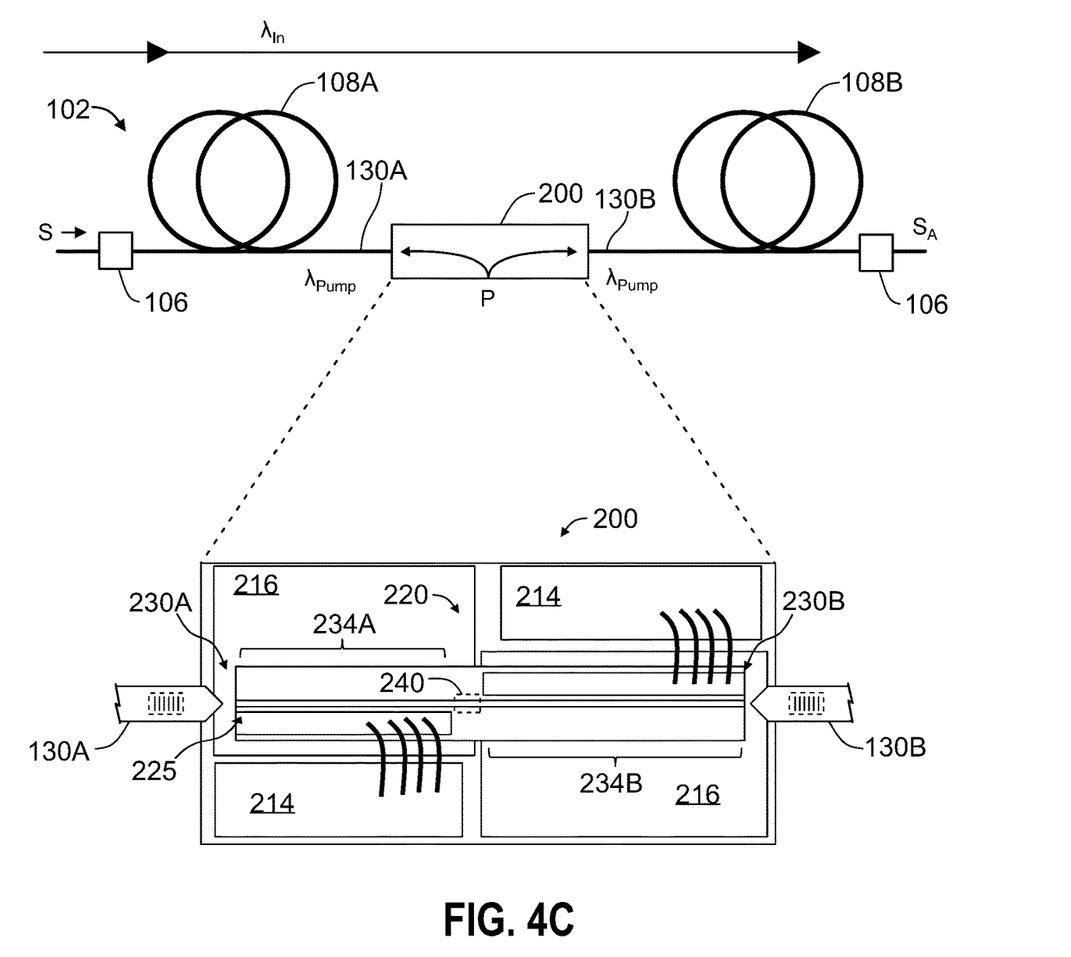
FIG. 4C illustrates a fiber amplifier having a doped fiber and yet another configuration of a pass-through pump laser.

In yet another configuration, FIG. 4C is a top schematic view of another laser diode 200 arranged for pass-through in a fiber amplifier 102 of the present disclosure. As illustrated in FIG. 4C, the laser diode 200 includes an input facet 230A, an output facet 230B, and an active section 220 positioned between the facets 230A-B. The laser diode 200 additionally includes a waveguide 225. The facets 230A-B, the active section 220, and the waveguide 225 are configured and operated in the same or similar manner as the corresponding components in other lasers described herein.

The laser diode 200 may additionally include a reflective structure 240 formed in the active section 220 between first and second portions 234A-B of the active section 220. The reflective structure 240 may be configured to optically isolate the first portion 234A of the active section 220 at least partially from the second portion 234B of the active section 220. The reflective structure 240 may include an etched mirror, a DFB structure, or other suitable structure formed in the active section 220. When implemented as a DFB structure, the reflective structure 240 may lock the laser 200 to a predetermined wavelength.

The placement of the reflective structure 240 within the active section 220 can divide the active section 220 into portions of equal or unequal length. For example, as illustrated in FIG. 4C, the first portion 234A can be shorter than the second portion 234B. In general, greater active section length leads to greater optical power output, all other parameters being equal. Accordingly, this configuration is another option to provide equal or different unequal optical power at the end facets 230A-B of the laser diode 200, if desired.

The laser diode 200 may further include a first cathode and anode 214, 216 electrically coupled to the first portion 234A of the active section 220 and may further include a second cathode and anode 214, 216 electrically coupled to the second portion 234B of the active section 220. In particular, the first cathode and anode 214, 216 may be electrically coupled to opposite sides (e.g., top and bottom) of the first portion 234A of the active section 220, and the second cathode and anode 214, 216 may be electrically coupled to opposite sides (e.g., top and bottom) of the second portion 234B of the active section 220. A first electrical drive signal may be injected through the first portion 234A via the first cathode and anode 214, 216, and a second electrical drive signal may be injected through the second portion 234B via the second cathode and anode 214, 216. Accordingly, while the first and second portions 234A-B of the active section 220 are integrally formed in a single structure (e.g., an epitaxial structure of the laser diode 200), they may nevertheless be independently operated.

As further shown in FIG. 4C, the pass-through pump laser diode 200 is used in a fiber amplifier system having the fiber amplifier 102 with the doped fiber 108. The input facet 230A is in optical communication with the input signal light S and is configured to receive the input light S, such as from an input fiber 130A. The waveguide 225 of the active section 220 of the diode 200 is configured to pass the input signal light S from the input facet 230A to the output facet 230B. The active section 220 is also configured to generate pump light P at a pump wavelength $\lambda_{Pump}$ in response to injection of the electrical drive signal into the active section 220. As noted, the pump wavelength $\lambda_{Pump}$ can be different from the input wavelength $\lambda_{In}$ that passes through the diode 200.

The fiber amplifier 102 has a fiber portion 130B and the doped fiber 108. The fiber portion 130B is in optical communication with the output facet 230B and is configured to receive the input signal light S and at least a portion of the pump light P from the output facet 230B. The pump wavelength $\lambda_{Pump}$ of the pump light P is configured to interact with the doped fiber 108 in the manner disclosed herein.

In arrangements disclosed herein, the structure of the waveguide 225 can be adjusted to achieve certain output ratios relative to the front and back fibres (130A-B). The structure of the waveguide 225 can be modified to change output ratio. Accordingly, in either FIG. 4B or 4C, the laser diode 200 including AR coating on both facets 230A-B can have facet reflectivities adjusted to achieve certain input/output ratio relative to fibers 130A-B. Additionally, or alternatively, the waveguide structure 225 can be adjusted to achieve certain input/output ratio from two fibers 130A-B. Either way, the input signal light (S) is configured to pass through the active section 220.

Figure 5:
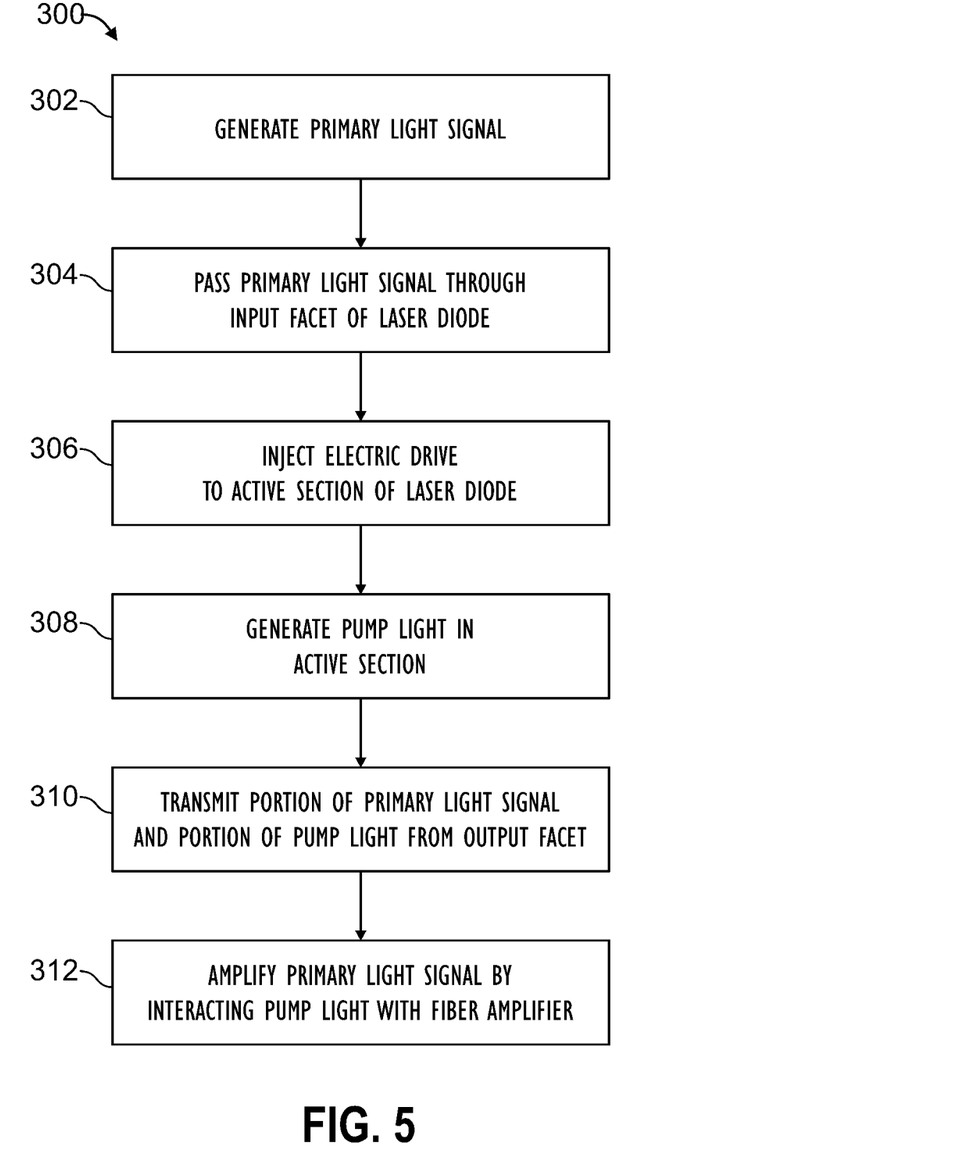
FIG. 5 illustrates a process for operating a fiber amplifier system having a pass-through laser diode according to the present disclosure.

FIG. 5 illustrates a process 300 for operating a fiber amplifier system 100 having a pass-through laser diode 200 according to the present disclosure. In the following description, reference numerals for elements from other figures are used for understanding. The laser diode 200 may include any of the laser diodes 200 described herein. The fiber amplifier system 100 may include a system as disclosed previously or any other appropriate fiber amplifier system.

A primary signal light S is generated or is received from a source (not shown) depending on the implementation (Block 302). For example, the system 100 can be used in optical fiber communications, and the source of the primary signal light S may be used for communications over a fiber network. The system 100 can be used in other implementations, such as in laser material processing. The primary signal light S having a primary wavelength is to be amplified by the fiber amplifier 102 and is then to be used for the purposes of the implementation, such as fiber communications, laser material processing, and the like.

The primary signal light S is transmitted to the laser diode 200, and a majority of the signal S that reaches the input end facet 230A is passed through the input end facet 230A to the diode's waveguide 225 (Block 304).

During operation, one or more electrical drive signals are injected into the active section 220 of the laser diode 200 via the one or more of anode 216 and cathode 214 (Block 306). As noted above, the drive signal may be injected using a cathode and an anode 214, 216. Additionally, multiple electrical drive signal can be injected into different portions of the active section 200 using multiple cathode and anode arrangements 214, 216. Moreover, the portions of the active section 220 may be optically isolated at least partially from the others by a reflective structure 240.

In response to the injected electrical drive signal, the active section 220 generates pump light P having a pump wavelength $\lambda_{Pump}$ (Block 308). As noted, the pump wavelength $\lambda_{Pump}$ can be intended to interact with a doped fiber 108.

The pass-through signal light S and the generated pump light P pass toward the output end facet 230B. Because the facets 230A-B have low reflectivity, some of the generated pump light P may travel out the input facet 230A with another amount traveling out of the output facet 230B. As noted above, techniques based on FBGs, different reflectivities, different transmissivities, and the like for the may be used for the laser diode 200 so that more of the pump light P travels out of the output facet 230B.

A majority of the primary signal light S and portion of the pump light P that reaches the output facet 230B passes through the facet 230B and into the opposing fiber portion 130B (Block 310). The light signals S+P then reach the doped fiber 108 where the primary signal light S is amplified by the interaction of the pump light P in the manner disclosed herein (Block 312).

In previous arrangements, the laser diode 200 and the doped fiber 108 are arranged in a forward pumping direction in which the pump light P co-propagates with the primary signal light S through the doped fiber 108. Other arrangements can be used. Moreover, the fiber amplifiers 102 disclosed herein can be used as part of an amplifier chain in multiple stages.

As noted above with respect to FIG. 4A, the laser diode 200 can be used in a co-pumping arrangement in which the pump light (P) is injected into a fiber amplifier that is downstream of the laser diode 200. As noted with respect to FIG. 4B, the laser diode 200 can be used in a dual-pumping arrangement in which the pump light is injected into fiber amplifiers that are upstream and downstream of the laser diode 200. Other arrangements are possible.

Figure 6A:
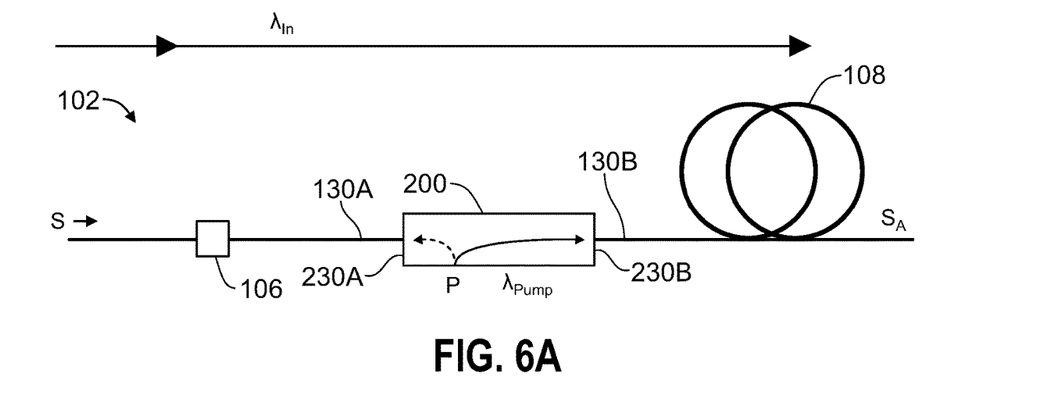
FIGS. 6A-6C illustrate fiber amplifiers having laser diodes arranged in various pumping directions relative to one or more doped fibers.

In a primary arrangement, FIG. 6A illustrates a fiber amplifier 102 having a laser diode 200 and a doped fiber 108 arranged in a co-pumping direction in which the pump light P propagates with the primary signal light S through the doped fiber 108, which is downstream of the laser diode 200. As noted, the laser diode 200 allows the primary signal light S being amplified to pass-through. As also noted, the laser diode 200 generates pump light P that may pass in both directions. Yet, the laser diode 200, the reflectivities of its facets (230A-B), the transmissivities of with waveguide (220), its multiple active regions, etc. can be configured to pass more pump light P in one direction over the other. Namely, more of the pump light P can pass from the output facet (230B) than from the input face (230B). This is merely schematically shown in FIG. 6A. In fact, an HR coating, such as discussed previously, at the input facet 230A can allow passage at the higher wavelength $\lambda_{In}$ of the signal light S, but may reflect at the lower wavelength $\lambda_{Pump}$ of the pump light P. In any event, the pump light P directed to the doped fiber 108 can amplify the signal light S.

Figure 6B:
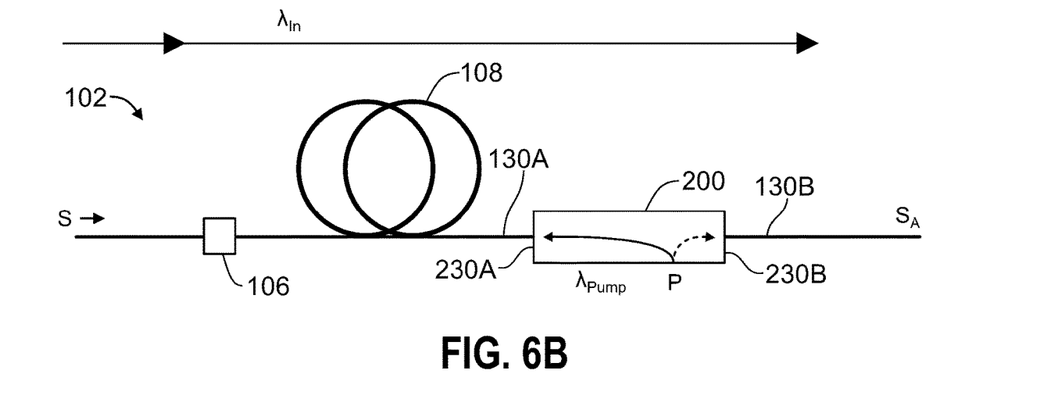

In alternative arrangement, FIG. 6B illustrates a fiber amplifier 102 having a laser diode 200 and a doped fiber 108 arranged in a backward pumping direction in which the pump light P propagates against the primary signal light S through the doped fiber 108. As noted, the laser diode 200 allows the primary signal light S being amplified to pass-through. As also noted, the laser diode 200 generates pump light P that may pass in both directions. Yet, the laser diode 200, the reflectivities of its facets (230A-B), the transmissivities of with waveguide (220), its multiple active regions, etc. can be configured to pass more pump light P in one direction over the other. Namely, more of the pump light P can pass from the input facet (230A) than from the output face (230B). This is merely schematically shown in FIG. 6B. In fact, an HR coating, such as discussed previously, at the output facet 230B can allow passage at the higher wavelength $\lambda_{In}$ of the signal light S, but may reflect at the lower wavelength $\lambda_{Pump}$ of the pump light P. In any event, the pump light P directed to the doped fiber 108 can amplify the signal light S.

Figure 6C:
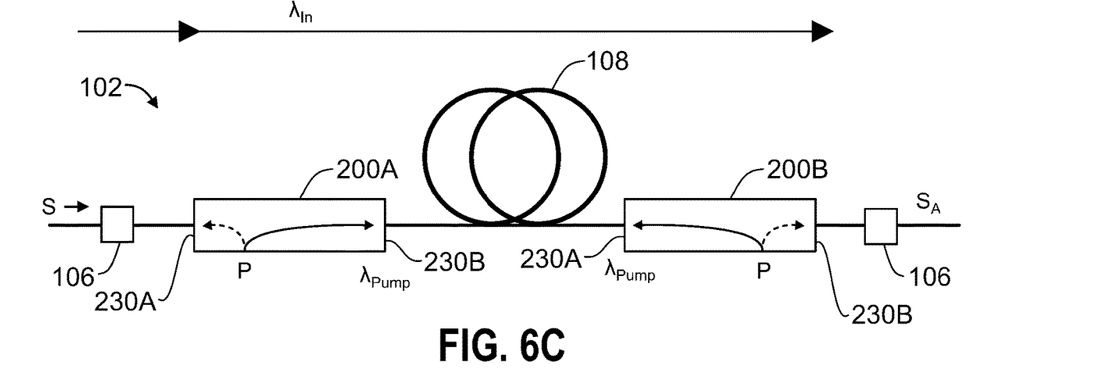

In yet another arrangement, FIG. 6C illustrates yet another fiber amplifier 102 having two laser diodes 200A-B arranged in opposing forward and backward pumping directions relative to a doped fiber 108. As noted, the laser diodes 200A-B allow the primary signal light S being amplified to pass-through. As also noted, the laser diodes 200A-B generate pump light P that may pass in both directions. Yet, the laser diodes 200A-B, the reflectivities of its facets (230A-B), the transmissivities of with waveguide (220), its multiple active regions, etc. can be configured to pass more, less, or equal portions of pump light P in forward and backward directions as desired. This is merely schematically shown in FIG. 6C. In fact, HR coatings, such as discussed previously, at the input facet 230A of the upstream diode 200A and at the output facet 230B of the downstream diode 200B can allow passage at the higher wavelength $\lambda_{In}$ of the signal light S, but may reflect at the lower wavelength $\lambda_{Pump}$ of the pump light P. In any event, the pump light P directed to the doped fiber 108 can amplify the signal light S.

In the configurations of the fiber amplifier 102 disclosed herein, the laser diode 200 allows the primary signal light S being amplified to pass-through while also generating the pump light P. Accordingly, the fiber amplifiers 102 do not require the pump light P to be coupled with the input signal light S using a coupler, such as a dichroic coupler, which simplifies the system and can reduce issues associated with such couplers.

In the configurations of the fiber amplifier 102 disclosed herein, isolators 106 can be used as appropriate to reduce parasitic reflections that can cause parasitic laser oscillation or can damage the fibers. These isolators 106 can be Faraday isolators.

In the configurations of the fiber amplifier 102 disclosed herein, multiple pass-through laser diodes 200 can be used together in a chain along the optical path. For example, instead of having one laser diode 200 to provide backward direction of pump light P to the doped fiber 108 as in FIG. 6B, multiple ones of the laser diodes 200 can be used, as long as considerations are made for the passage of pump light P from one of the diodes 200 through the active region of the other diodes 200. Likewise, instead of having one laser diode 200 to provide backward and forward direction of pump light P to the doped fibers 108A-B as in FIG. 4B, multiple ones of the laser diodes 200 can be used, as long as considerations are made for the passage of pump light P from one of the diodes 200 through the active region of other diodes 200.

The foregoing description of preferred and other embodiments is not intended to limit or restrict the scope or applicability of the inventive concepts conceived of by the Applicants. It will be appreciated with the benefit of the present disclosure that features described above in accordance with any embodiment or aspect of the disclosed subject matter can be utilized, either alone or in combination, with any other described feature, in any other embodiment or aspect of the disclosed subject matter.

What is claimed is:

1. A fiber amplifier operable with an electric drive signal for amplifying signal light having a signal wavelength, the fiber amplifier comprising:
   a laser diode having an active section and having an input facet and an output facet, the input and output facets in optical communication with the signal light and configured to pass the signal light through the laser diode from the input facet to the output facet, the active section being configured to generate pump light in response to injection of the electrical drive signal into the active section, the pump light having a pump wavelength different from the signal wavelength; and
   a fiber doped with an active dopant, the fiber being in optical communication with the signal light and being in optical communication with at least a portion of the pump light from the laser diode, the pump wavelength of the pump light configured to interact with the active dopant of the fiber and thereby amplify the signal light.

2. The fiber amplifier of claim 1, comprising at least one fiber Bragg grating (FBG) configured to lock the pump light from at least one of the input and output facets to the pump wavelength.

3. The fiber amplifier of claim 1, wherein:
   the active section comprises a waveguide extending between the input and output facets;
   a first portion of the waveguide near the input facet has a first transmissivity at least at the pump wavelength;
   a second portion of the waveguide near the output facet has a second transmissivity at least at the pump wavelength; and
   the first transmissivity is different from the second transmissivity.

4. The fiber amplifier of claim 1, wherein the input facet comprises a first reflectivity at least at the pump wavelength; wherein the output facet comprises a second reflectivity at least at the pump wavelength; and wherein the first reflectivity is different from the second reflectivity.

5. The fiber amplifier of claim 1, wherein the active section of the laser diode further comprises a reflective structure formed in the active section between first and second portions of the active section, the reflective structure configured to at least partially isolate optical communication of the pump light from one of the first and second portions to the other.

6. The fiber amplifier of claim 1, further comprising a first fiber coupling configured to communicate the signal light with the input facet; and a second fiber coupling configured to communicate the signal light with the output facet.

7. The fiber amplifier of claim 1, the signal wavelength being in a 1550-nm range, wherein the pump wavelength is in a 980-nm and/or 1480-nm range; and
   wherein the dopant of the fiber comprises erbium.

8. The fiber amplifier of claim 1, further comprising an isolator disposed between the signal light and the input facet.

9. The fiber amplifier of claim 1, comprising more than one of the laser diode.

10. The fiber amplifier of claim 9, wherein a first of the laser diodes has the output face in optical communication with the fiber downstream of the first laser diode;

and wherein a second of the laser diodes has the output face in optical communication with the fiber upstream of the second laser diode.

11. The fiber amplifier of claim 1, comprising more than one of the fiber doped with the active dopant.

12. The fiber amplifier of claim 11, wherein the input facet is disposed in optical communication with a first of the fibers upstream of the laser diode; and wherein the output facet is disposed in optical communication with a second of the fibers downstream of the laser diode.

13. The fiber amplifier of claim 1, wherein the fiber is in optical communication with at least the portion of the pump light transmitted from the input facet of the laser diode.

14. The fiber amplifier of claim 1, wherein the fiber is in optical communication with at least the portion of the pump light transmitted from the output facet of the laser diode.

15. A method used with signal light having a signal wavelength, the method comprising:
   receiving the signal light at an input facet of a laser diode;
   passing the signal light from the input facet through the laser diode to an output facet;
   generating pump light in an active section of the laser diode by injecting an electrical drive signal into the active section of the laser diode, the pump light having a pump wavelength different from the signal wavelength;
   transmitting the signal light and at least a portion of the pump light to a doped fiber amplifier in optical communication with the laser diode; and
   amplifying the signal light by interacting the pump light with the doped fiber amplifier.

16. The method of claim 15, comprising using at least one fiber Bragg grating (FBG) configured to lock the pump light from at least one of the input and output facets to the pump wavelength.

17. The method of claim 15, comprising configuring a first portion of a waveguide of the active section near the input facet with a first transmissivity at least at the pump wavelength; and configuring a second portion of the waveguide near the output facet with a second transmissivity at least at the pump wavelength, the second transmissivity being different from the first transmissivity.

18. The method of claim 15, comprising configuring the input facet with a first reflectivity at least at the pump wavelength; and configuring the output facet with a second reflectivity at least at the pump wavelength different from the first reflectivity.

19. The method of claim 15, wherein injecting the electrical drive signal into the active section comprises:
   injecting a first of the electrical drive signal into a first portion of the active section;
   injecting a second of the electrical drive signal into a second portion of the active section; and
   optically isolating at least a portion of the pump light generated with one of the first and second portions of the active section from the other of the first and second portions of the active section.

20. The method of claim 15, the signal wavelength being in a 1550-nm range, wherein the pump wavelength is in a 980-nm and/or 1480-nm range; and
   wherein the doped fiber amplifier comprises an active dopant of erbium.

* * * * *